(12) United States Patent
Chiu et al.

(10) Patent No.: US 10,812,032 B2
(45) Date of Patent: Oct. 20, 2020

(54) METHOD OF AUTOMATICALLY DECREASING VOLUME AND ELECTRONIC DEVICE

(71) Applicant: MERRY ELECTRONICS (SHENZHEN) CO., LTD., Guangdong (CN)

(72) Inventors: Kuan-Ling Chiu, Taichung (TW); Hung-Yue Chang, Taichung (TW)

(73) Assignee: MERRY ELECTRONICS (SHENZHEN) CO., LTD., Guangdong (CN)

( * ) Notice: Subject to any disclaimer, the term of this patent is extended or adjusted under 35 U.S.C. 154(b) by 0 days.

(21) Appl. No.: 16/425,965

(22) Filed: May 30, 2019

(65) Prior Publication Data

US 2020/0228084 A1 Jul. 16, 2020

(30) Foreign Application Priority Data

Jan. 10, 2019 (TW) .............................. 108101053 A

(51) Int. Cl.
*H03G 7/00* (2006.01)
*H04R 29/00* (2006.01)
*H04R 3/00* (2006.01)

(52) U.S. Cl.
CPC .............. *H03G 7/002* (2013.01); *H04R 3/00* (2013.01); *H04R 29/001* (2013.01); *H04R 2430/01* (2013.01)

(58) Field of Classification Search
USPC ...................... 381/56, 58, 61, 104, 106, 107
See application file for complete search history.

(56) References Cited

U.S. PATENT DOCUMENTS

| 9,832,581 | B1 | 11/2017 | Yang et al. |
| 9,979,368 | B1 | 5/2018 | Yang et al. |
| 2014/0281974 | A1* | 9/2014 | Shi .......................... G11B 27/28 715/716 |
| 2017/0366891 | A1* | 12/2017 | Yang ....................... G06F 3/165 |

FOREIGN PATENT DOCUMENTS

| TW | 201225661 A | 6/2012 |
| TW | I613646 B | 2/2018 |

* cited by examiner

*Primary Examiner* — Yosef K Laekemariam
(74) *Attorney, Agent, or Firm* — CKC & Partners Co., LLC

(57) ABSTRACT

A method of automatically decreasing volume includes detecting a volume of a sound generated by an electronic device; determining whether the volume is in a first volume range or in a second volume range, wherein the volume in the first volume range is higher than the volume in the second volume range; calculating a first single drop amount according to the volume when the volume is in the first volume range; and calculating a second single drop amount according to the volume when the volume is in the second volume range, wherein the second single drop amount is less than the first single drop amount.

19 Claims, 7 Drawing Sheets

METHOD OF AUTOMATICALLY DECREASING VOLUME AND ELECTRONIC DEVICE

CROSS-REFERENCE TO RELATED APPLICATION

This application claims priority to Taiwan Application Serial Number 108101053, filed Jan. 10, 2019, which is herein incorporated by reference in its entirety.

BACKGROUND

Field of Invention

The present invention relates to a method of automatically decreasing volume. More particularly, the present invention relates to an electronic device using the method of automatically decreasing volume.

Description of Related Art

With the wide adoption of handheld electronic products, people tend to use these electronic products for many hours, especially to listen to music or to watch movies. However, prolonged exposure of the ears to a high-volume environment is likely to cause hearing loss.

According to the World Health Organization, continuous exposure to volume levels of 85 dB for 8 hours or 100 dB volume for 15 minutes may cause temporary hearing loss or tinnitus; in other words, the higher the volume becomes, the shorter the time for which the ears can endure it. When the ears are exposed to an extremely high sound volume, or the ears are exposed to a high-volume environment for too long, permanent damage to the auditory cells in the ear may result.

Therefore, it is necessary to propose a hearing protection means for controlling the playing time of an electronic device outputting different volumes.

SUMMARY

The invention provides a method of automatically decreasing volume. The method includes detecting a volume of a sound generated by an electronic device; determining whether the volume is in a first volume range or in a second volume range, wherein the volume in the first volume range is higher than the volume in the second volume range; calculating a first single drop amount according to the volume when the volume is in the first volume range; and calculating a second single drop amount according to the volume when the volume is in the second volume range, wherein the second single drop amount is less than the first single drop amount.

In some embodiments of the present disclosure, the first volume range is greater than about 100 dB.

In some embodiments of the present disclosure, the first volume range is formed by a plurality of the first single drop amounts that are consecutive.

In some embodiments of the present disclosure, the second volume range is in a range from about 85 dB to about 100 dB.

In some embodiments of the present disclosure, the first single drop amount per unit time within the first volume range is defined as a first volume drop rate, the second single drop amount per unit time within the second volume range is defined as a second volume drop rate, and the second volume drop rate is less than the first volume drop rate.

In some embodiments of the present disclosure, the second volume drop rate of the second volume range is less than ⅔ of the first volume drop rate of the first volume range.

The invention provides an electronic device. The electronic device includes a sonic processor, a detecting unit, and a control unit. The sonic processor configured to generate a sound. The detecting unit is configured to detect a first volume of the sound generated by the electronic device. The control unit is configured to determine whether the first volume is in a first consecutive drop range or in a second consecutive drop range. The control unit is further configured to decrease the first volume according to a first single drop amount when the first volume is in the first consecutive drop range. The control unit is further configured to decrease the first volume according to a second single drop amount when the first volume is in the second consecutive drop range. The first consecutive drop range corresponds to a first time interval, the second consecutive drop range corresponds to a second time interval and the second time interval is not consecutive to the first time interval.

In some embodiments of the present disclosure, the control unit is configured to calculate the first single drop amount or second single drop amount according to the first volume.

In some embodiments of the present disclosure, the first and second consecutive drop ranges are in a range from about 85 dB to about 120 dB.

In some embodiments of the present disclosure, the first consecutive drop range is formed by a plurality of the first single drop amounts that are consecutive.

In some embodiments of the present disclosure, the second consecutive drop range is formed by a plurality of the second single drop amounts that are consecutive.

In some embodiments of the present disclosure, the control unit is further configured to maintain the first volume in a third time interval when the first volume is in a first volume maintaining range. The first volume maintaining range is consecutive between the first and second consecutive drop ranges and a length of the third time interval is greater than any of lengths of the first and second time intervals.

In some embodiments of the present disclosure, the control unit is further configured to maintain the first volume in a fourth time interval when the first volume is in a second volume maintaining range. The fourth time interval is not consecutive to the third time interval.

In some embodiments of the present disclosure, the control unit is configured to calculate a first playing dosage according to the first consecutive drop range and the first time interval, to calculate a second playing dosage according to the first volume maintaining range and the third time interval, to determine whether a sum of the first and second playing dosages is greater than a preset cumulative value, and to limit the electronic device to generate another sound with a volume greater than a preset volume when the sum of the first and second playing dosages is greater than the preset cumulative value. The volumes in the first and second consecutive drop ranges are greater than the preset volume.

In some embodiments of the present disclosure, the first single drop amount per unit time within the first consecutive drop range is defined as a first volume drop rate, the second single drop amount per unit time within the second consecutive drop range is defined a second volume drop rate, and the second volume drop rate is less than or substantially equal to the first volume drop rate.

In some embodiments of the present disclosure, the first and second volume drop rates are in a range from about 0.1 dB/sec to about 0.5 dB/sec.

In some embodiments of the present disclosure, an amplitude of the second consecutive drop range is substantially the same as an amplitude of the first consecutive drop range.

In some embodiments of the present disclosure, an amplitude of the second consecutive drop range is different from an amplitude of the first consecutive drop range.

In some embodiments of the present disclosure, the second time interval is later than the first time interval and a length of the second time interval is greater than or substantially equal to a length of the first time interval.

In some embodiments of the present disclosure, the control unit is further configured to determine whether a second volume is greater than the first volume, wherein a detecting time point of the second volume is later than a detecting time point of the first volume. The control unit is further configured to calculate a third single drop amount according to the second volume when the second volume is greater than the first volume, wherein the third single drop amount is greater than or substantially equal to any of the first and second single drop amounts.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
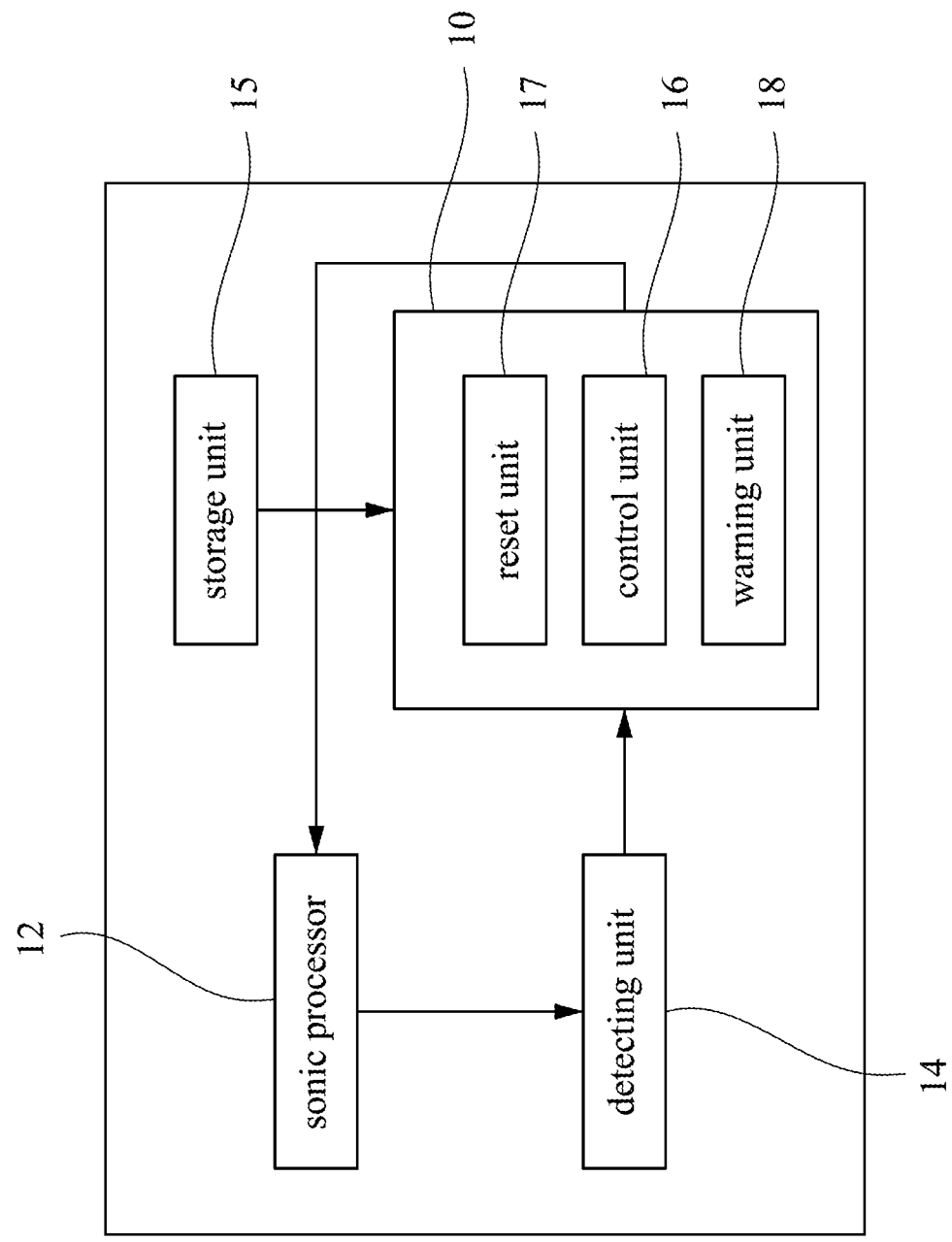
FIG. 1 is a schematic diagram of an electronic device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1. FIG. 1 is a schematic diagram of an electronic device 1 in accordance with some embodiments of the present disclosure. As shown in FIG. 1, in the embodiment, the electronic device 1 includes a sonic processor 12, a detecting unit 14, a storage unit 15, and a signal processor 10. The signal processor 10 includes a control unit 16, a reset unit 17, and warning unit 18.

Figure 3B:
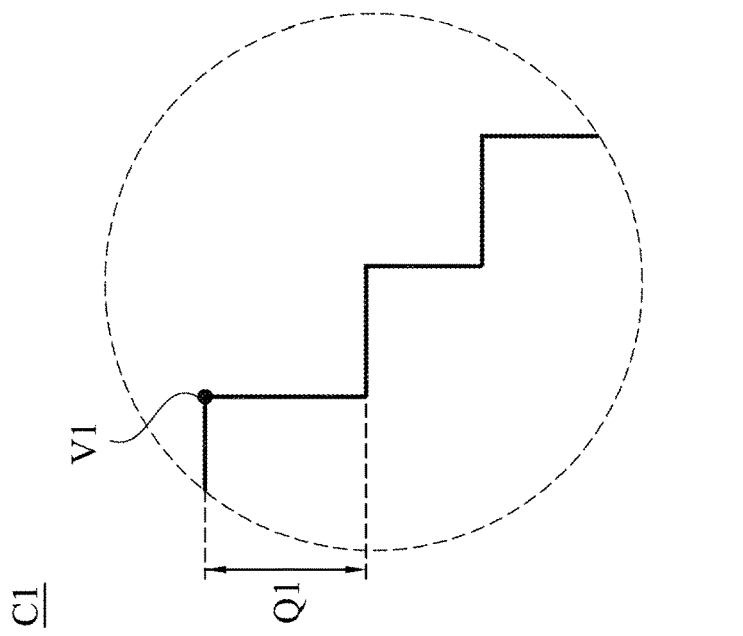
FIG. 3B is a partial enlarged view of an area C1 in FIG. 3A in accordance with some embodiments of the present disclosure.
Figure 3A:
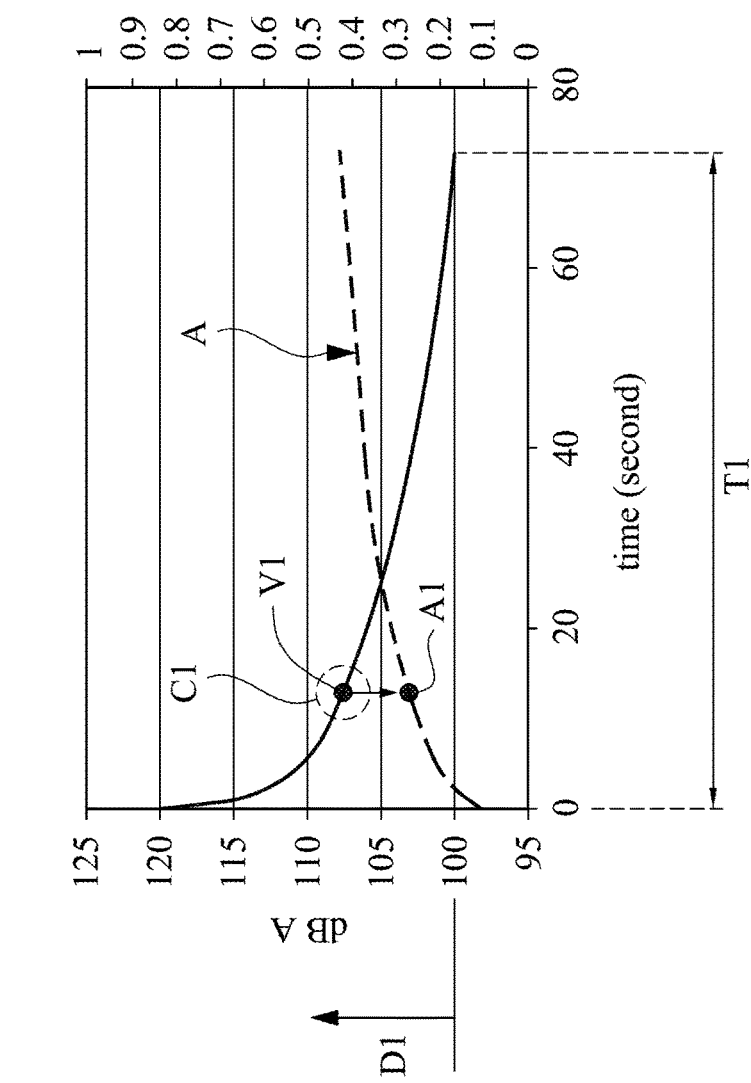
FIG. 3A is a schematic diagram of volume corresponding to time generated by a method of automatically decreasing volume in accordance with some embodiments of the present disclosure.
Figure 4A:
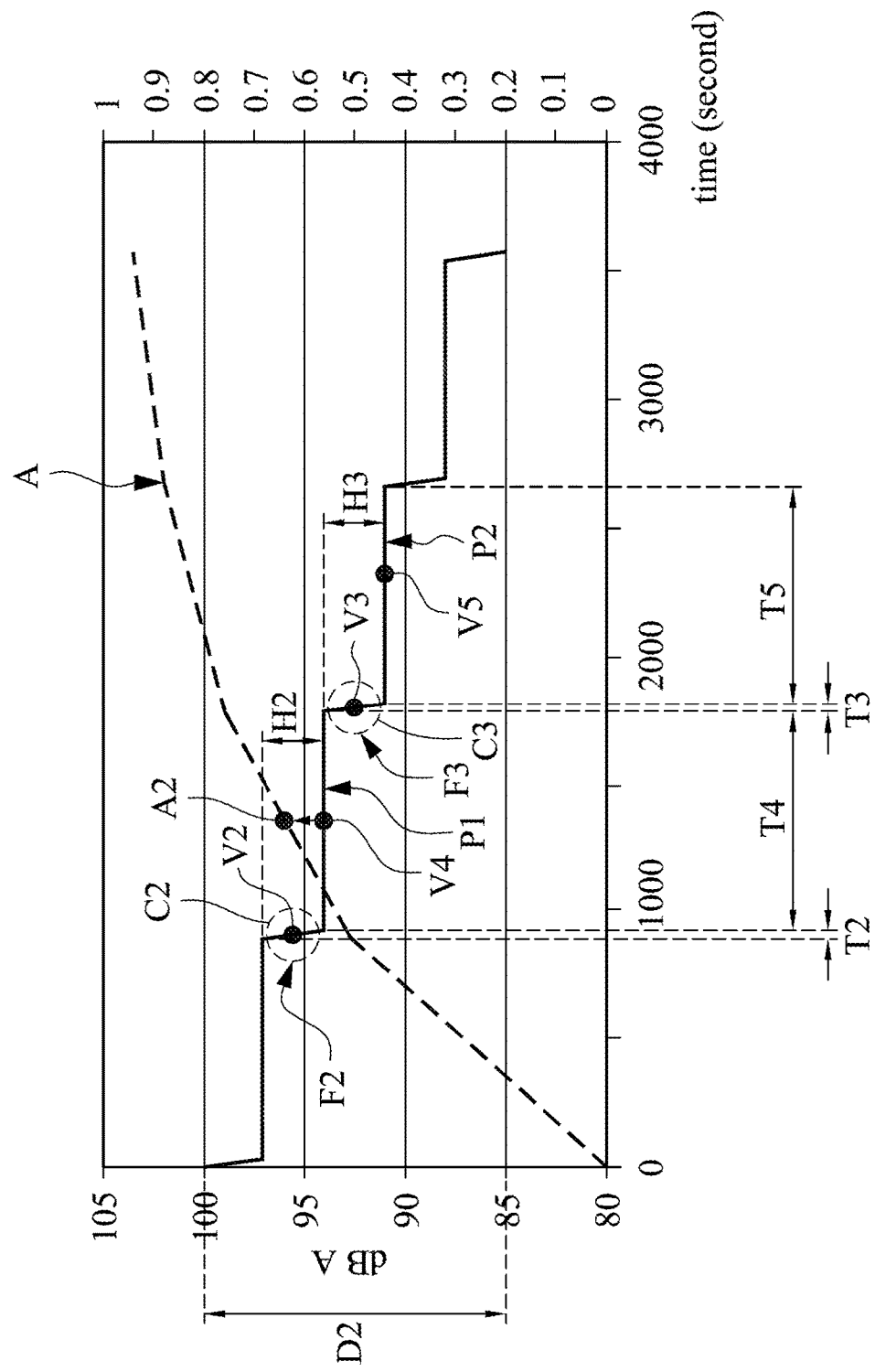
FIG. 4A is a schematic diagram of volume corresponding to time generated by a method of automatically decreasing volume in accordance with some embodiments of the present disclosure.

In FIG. 1, the sonic processor 12 of the electronic device 1 is electrically connected to the control unit 16 and is configured to generate a sound. For example, the sonic processor 12 includes components such as a speaker and/or an audio amplifier. The detecting unit 14 is electrically connected to the control unit 16 and is configured to detect the volume of the sound generated by the electronic device 1. The control unit 16 can be configured to determine that the detected volume is in a first volume range D1 as shown in FIG. 3A or in a second volume range D2 as shown in FIG. 4A. In some embodiments, the control unit 16 can be further configured to determine that the detected volume is in a first consecutive drop range F2 in the second volume range D2 as shown in FIG. 4A or in a second consecutive drop range F3 in the second volume range D2 as shown in FIG. 4A.

In the embodiment, the volume of the first volume range D1 is greater than the volume of the second volume range D2, and the second volume range D2 is consecutive to the first volume range D1. For example, the volume in the first volume range D1 is greater than about 100 dB, and the volume in the second volume range D2 is between about 85 dB and about 100 dB, but the present disclosure is not limited thereto. In some embodiments, the volume in the first volume range D1 is greater than about 120 dB, and the volume in the second volume range D2 is between about 85 dB and about 120 dB.

In the embodiment, the storage unit 15 is electrically connected to the signal processor 10. The storage unit 15 of the electronic device 1 is configured to store data. The reset unit 17 is configured to reset the data stored in the storage unit 15. The warning unit 18 is configured to receive signals of the control unit 16, and then issue a warning by means of sound, light, vibration or a combination thereof. It is noted that the above-described modules can be implemented in hardware devices, software programs, firmware, or a combination thereof, and they can also be configured as electrical circuits or other suitable forms; furthermore, each module can be implemented independently or can be combined with any other modules. In addition, the present embodiment is merely a preferred embodiment of the present invention, and for the sake of brevity, not all possible combinations and variations are described. However, it is known to those who are skilled in the art that the above-described modules or elements may not be necessary. For the purpose of the invention, it may also contain other well-known modules or elements. Each module or component may be omitted or modified as needed, and there may be any other modules or components between any two modules.

Figure 2:
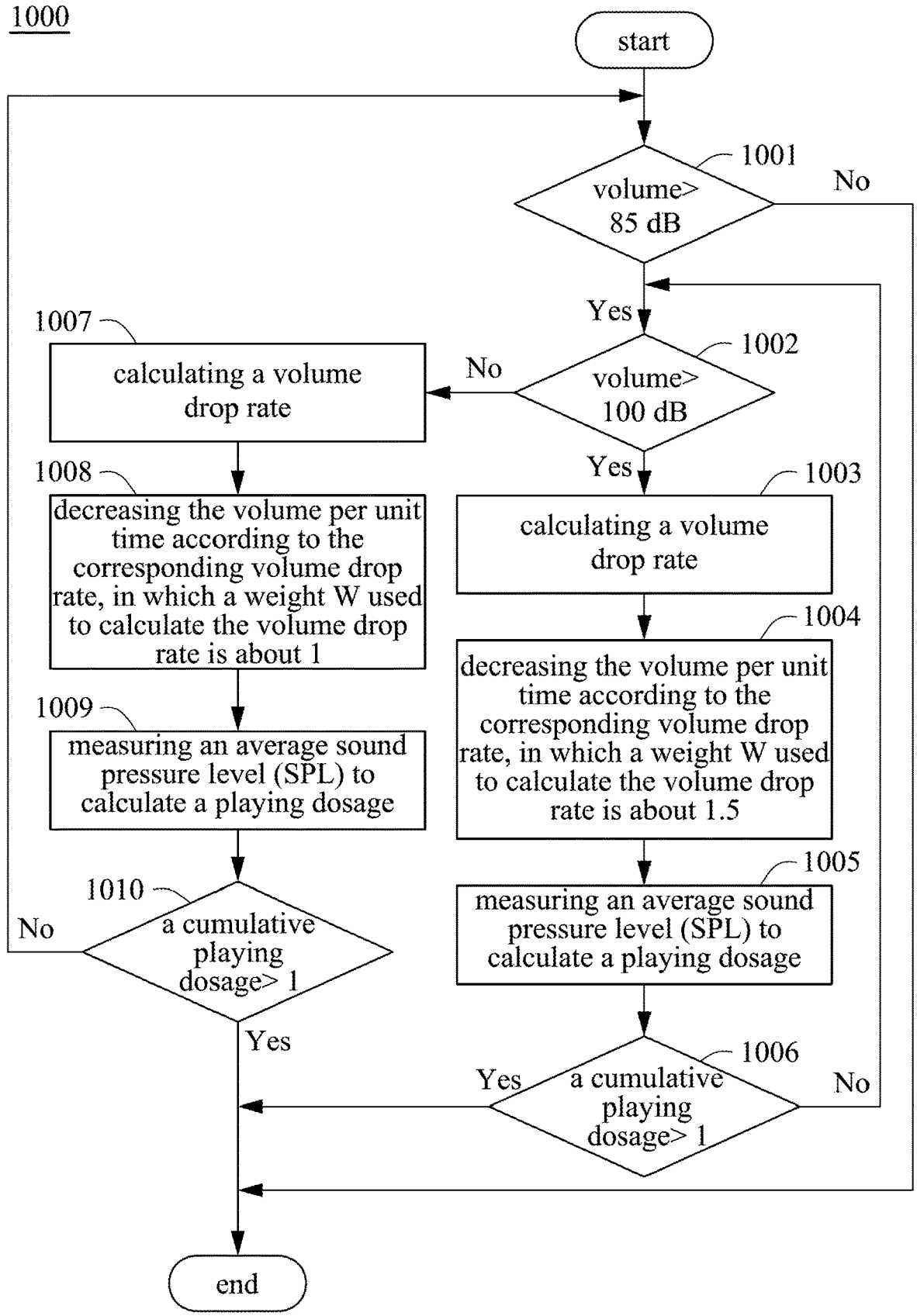
FIG. 2 is a flow chart of a method of automatically decreasing volume in accordance with some embodiments of the present disclosure.

Reference is made to FIG. 2. FIG. 2 is a flow chart of method 1000 of automatically decreasing volume in accordance with some embodiments of the present disclosure. It is understood that FIG. 2 has been simplified for a better understanding of the embodiments of the present disclosure. Accordingly, additional processes may be provided before, during, and after the stages of fabrication of FIG. 2, and some other processes may be briefly described herein.

Specifically, method 1000 of automatically decreasing volume includes step 1001 to step 1010. In the embodiment, method 1000 of automatically decreasing volume is performed by using the electronic device 1 as shown in FIG. 1 as an example.

In step 1001, it is determined by the control unit 16 whether the volume generated by the sonic processor 12 is located in the first or second volume range D1 or D2. That is, it is determined by the control unit 16 whether the volume generated by the sonic processor 12 is greater than a lower boundary value of the second volume range D2 (e.g., about 85 dB). When the volume generated by the sonic processor 12 is located in the first or second volume range D1 or D2 (e.g., greater than about 85 dB), step 1002 is performed. On the contrary, when the volume generated by the sonic processor 12 is not located in the first and second volume ranges D1 and D2 (e.g., no greater than about 85 dB), method 1000 of automatically decreasing volume is ended.

In step 1002, it is determined by the control unit 16 whether the volume generated by the sonic processor 12 is located in the first volume range D1 (e.g., greater than about 100 dB) or in the second volume range D2 (e.g., no greater than about 100 dB). When the volume generated by the sonic processor 12 is located in the first volume range D1 (e.g., greater than about 100 dB), then step 1003 is performed. When the volume generated by the sonic processor 12 is in the second volume range D2 (e.g., no greater than about 100 dB), then step 1007 is performed.

In step 1003, in the case where the volume generated by the electronic device 1 is in the first volume range D1 (e.g., greater than about 100 dB), a volume drop rate R1 is calculated by the control unit 16. Please refer to FIGS. 3A and 3B. FIG. 3A is a schematic diagram of volume corresponding to time generated by step 1003 of method 1000 of automatically decreasing volume in accordance with some embodiments of the present disclosure. FIG. 3B is a partial enlarged view of an area C1 in FIG. 3A in accordance with some embodiments of the present disclosure.

As shown in FIG. 3A, in step 1003, volume of the sound detected by the detecting unit 14 is greater than about 100 dB. That is, volume of the sound detected by the detecting unit 14 is located in the first volume range D1. When the volume generated by the electronic device 1 is in the first volume range D1, a corresponding single drop amount is calculated per unit time according to the detected volume.

Specifically, the first volume range D1 is formed by a plurality of the single drop amounts that are consecutive. That is, the generated volume greater than about 100 dB will be decreased in each unit time by a corresponding single drop amount, until the generated volume reaches a lower boundary value (e.g., about 100 dB) of the first volume range D1, thereby forming the first volume range D1.

In the embodiment, a formula of single drop amount Q corresponding to volume V in the first volume range D1 is designed as:

$$Q=((V-X)/T)\times W;\text{ and}$$

$T=8\times 60\times 60/2^{((V-X)/3)}$, where V represents volume detected by the detecting unit 14 per unit time; X represents the lower boundary value of the second volume range D2; and W represents a weight belonging to a specific volume range (e.g., the first volume range D1). In the embodiment, volume V is located in the first volume range D1, the lower boundary value of the second volume range D2 is about 85 dB, and weight W for the first volume range D1 is designed to be about 1.5, but the present disclosure is not limited thereto.

For example, in FIG. 3A, when the volume V1 is located in the first volume range D1, the control unit 16 is configured to calculate a single drop amount Q1 from the aforementioned formula according to the volume V1 (see FIG. 3B). Further, the control unit 16 is configured to calculate the volume drop rate R1 corresponding to the volume V1. Specifically, the volume drop rate R1 is defined as the single drop amount Q1 per unit time in the first volume range D1. In some embodiments, the volume drop rate R1 is greater than or substantially equal to 0.1 (dB/sec), but the present disclosure is not limited thereto.

In step 1004, in the case where the volume generated by the electronic device 1 is in the first volume range D1 (e.g., greater than about 100 dB), the volume generated by the sonic processor 12 is decreased per unit time according to the volume drop rate R1 calculated by the control unit 16, in which the weight W used to calculate the volume drop rate R1 is designed to be about 1.5.

In step 1005, in the case where the volume generated by the electronic device 1 is in the first volume range D1 (e.g., greater than about 100 dB), the average sound pressure level (SPL) is measured by the detecting unit 14 to further calculate a playing dosage corresponding to the volume per unit time through the control unit 16. Next, the control unit 16 is configured to accumulate the calculated playing dosage to the sum of the playing dosage of the entire generated volume (including the first and second volume ranges D1 and D2) to obtain a cumulative playing dosage per unit time. The cumulative playing dosage is used to determine in step 1006.

In the embodiment, a formula of the playing dosage S corresponding to volume per unit time is designed as:

$$S=t/T;\text{ and}$$

$T=8\times 60\times 60/2^{((V-X)/3)}$, where t represents unit time for a single drop amount; V represents volume detected by the detecting unit 14 per unit time; and X represents the lower boundary value of the second volume range D2. In the embodiment, unit time t is about 1 second, volume V is located in the first volume range D1, and the lower boundary value X of the second volume range D2 is about 85 dB, but the present disclosure is not limited thereto.

For example, in FIG. 3A, when the volume V1 is located in the first volume range D1, the control unit 16 is configured to calculate a corresponding playing dosage per unit time according to the volume V1. Next, the control unit 16 is configured to accumulate the calculated playing dosage to the sum of the playing dosage of the entire generated volume to obtain a cumulative playing dosage A1. Therefore, the control unit 16 can plot the cumulative playing dosage curve A as shown in FIG. 3A for the volume detected by the detecting unit 14 per unit time.

In step 1006, in the case where the volume generated by the electronic device 1 is in the first volume range D1 (e.g., greater than about 100 dB), it is determined by the control unit 16 whether the cumulative playing dosage is greater than a preset cumulative value per unit time. In the embodiment, the preset cumulative value is designed to be 1, but the present disclosure is not limited thereto. When the cumulative playing dosage is not greater than the preset cumulative value, then step 1002 is re-executed. When the cumulative playing dosage is greater than the preset cumulative value, the control unit 16 is configured to restrict the electronic device 1 from generating a sound greater than the lower boundary value of the second volume range D2 and to end method 1000 of automatically decreasing volume. Thereby, method 1000 can prevent the user from receiving a strong volume for a period of time to cause hearing damage.

In some embodiments, when the cumulative playing dosage is greater than the preset cumulative value, the warning unit 18 as shown in FIG. 1 receives the signal from the control unit 16, and then issues an alert in the manner of sound, light, vibration or a combination thereof to remind the user of the electronic device 1 that only the sound below the lower boundary value of the second volume range D2 can be generated, so as to avoid the user's hearing damage. In some embodiments, the user can actively use the reset unit 17 as shown in FIG. 1 to reset the cumulative playing dosage.

Figure 4C:
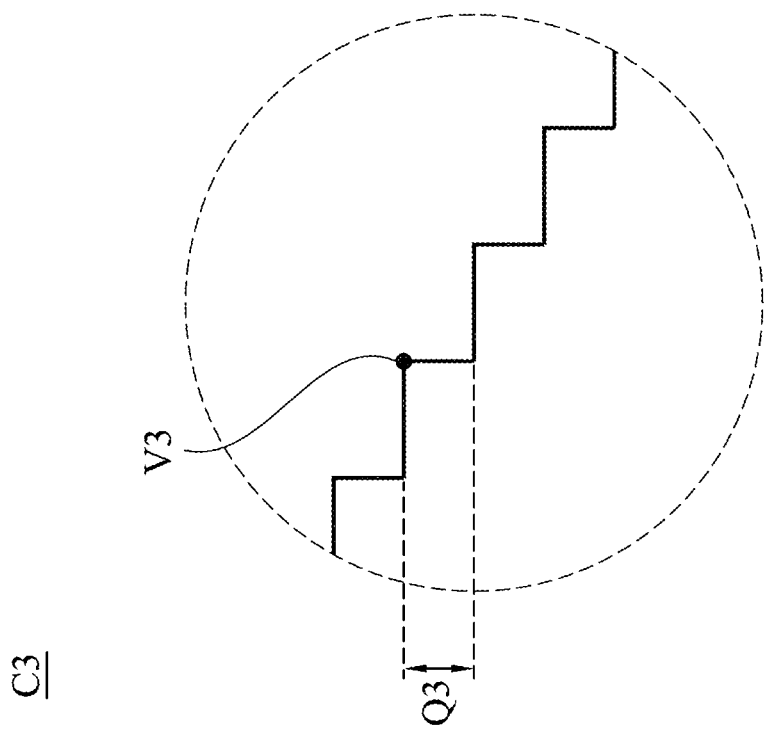
FIG. 4C is a partial enlarged view of an area C3 in FIG. 4A in accordance with some embodiments of the present disclosure.
Figure 4B:
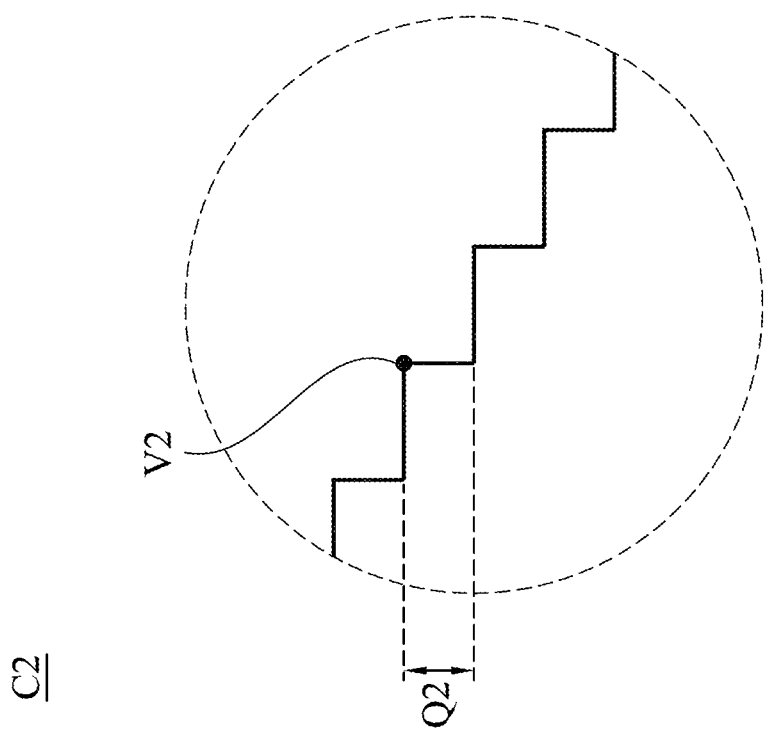
FIG. 4B is a partial enlarged view of an area C2 in FIG. 4A in accordance with some embodiments of the present disclosure.

In step 1007, in the case where the volume generated by the electronic device 1 is in the second volume range D2 (e.g., between about 85 dB and about 100 dB), a volume drop rate is calculated by the control unit 16. Please refer to FIGS. 4A, 4B, and 4C. FIG. 4A is a schematic diagram of volume corresponding to time generated by step 1007 of method 1000 of automatically decreasing volume in accordance with some embodiments of the present disclosure. FIG. 4B is a partial enlarged view of an area C2 in FIG. 4A in accordance with some embodiments of the present disclosure. FIG. 4C is a partial enlarged view of an area C3 in FIG. 4A in accordance with some embodiments of the present disclosure.

As shown in FIG. 4A, in step 1007, volume of the sound detected by the detecting unit 14 is between about 85 dB and about 100 dB. That is, volume of the sound detected by the detecting unit 14 is located in the second volume range D2. The second volume range D2 has at least one consecutive drop range and at least one volume maintaining range. Specifically, an amplitude of each consecutive drop range is substantially the same, but the present disclosure is not limited thereto. For example, the amplitude of the consecutive drop range can be about 3 dB. The volumes of the volume maintaining ranges are substantially different from each other, but the present disclosure is not limited thereto. In the embodiment, the control unit 16 is configured to determine that the detected volume is in a consecutive drop range of the second volume range D2 or in a volume maintaining range of the second volume range D2.

When the volume is located in the consecutive drop range of the second volume range D2, a corresponding single drop amount is calculated per unit time according to the detected volume. Specifically, the consecutive drop range is formed by a plurality of the single drop amounts that are consecutive. That is, the generated volume located in the consecutive drop range will be decreased in each unit time by a corresponding single drop amount, until the amplitude of the generated volume reaches a preset value (e.g., about 3 dB) and/or until the generated volume reaches the lower boundary value of the second volume range D2 (e.g., about 85 dB), thereby forming the consecutive drop range.

In the embodiment, a formula of volume V corresponding to single drop amount Q in the consecutive drop range is designed as:

$Q=((V-X)/T) \times W$; and $T=8 \times 60 \times 60/2^{((V-X)/3)}$, where V represents volume detected by the detecting unit 14 per unit time; X represents the lower boundary value of the second volume range D2; and W represents a weight belonging to a specific volume range (e.g., the second volume range D2). In the embodiment, volume V is located in the second volume range D2, the lower boundary value of the second volume range D2 is about 85 dB, and weight W for the second volume range D2 is designed to be 1, but the present disclosure is not limited thereto. Further, the control unit 16 is configured to calculate a volume drop rate corresponding to the volume. Specifically, the volume drop rate is defined as a single drop amount per unit time in the consecutive drop range.

For example, in FIG. 4A, when the volume V2 is located in the consecutive drop range F2 of the second volume range D2, the control unit 16 is configured to calculate a single drop amount Q2 from the aforementioned formula according to the volume V2 (see FIG. 4B) and further to calculate the volume drop rate R2. Specifically, the consecutive drop range F2 is formed by a plurality of the single drop amounts Q2 that are consecutive and corresponds to a time internal T2. Similarly, when the volume V3 is located in the consecutive drop range F3 of the second volume range D2, the control unit 16 is configured to calculate a single drop amount Q3 from the aforementioned formula according to the volume V3 (see FIG. 4C) and further to calculate the volume drop rate R3. Specifically, the consecutive drop range F3 is formed by a plurality of the single drop amounts Q3 that are consecutive and corresponds to a time internal T3.

In the embodiment, the volume drop rate R3 of the consecutive drop range F3 is substantially equal to the volume drop rate R2 of the consecutive drop range F2, but the present disclosure is not limited thereto. In some embodiment, the volume drop rate R3 can be less than the volume drop rate R2. In some embodiment, a volume drop rate in the consecutive drop range can be in a range from about 0.1 (dB/sec) to about 0.5 (dB/sec). In some embodiment, a volume drop rate in the consecutive drop range can be designed to be about 0.1 (dB/sec), but the present disclosure is not limited thereto.

On the contrary, when the volume is located in the volume maintaining range of the second volume range D2, the control unit 16 is configured to maintain the volume in a time interval corresponding to the volume maintaining range. Specifically, the volume maintaining range is consecutive between the two consecutive drop ranges. A length of the time interval corresponding to the volume maintaining range is greater than lengths of time intervals corresponding to the two consecutive drop ranges. In the embodiment, a formula of length Th of a time interval corresponding to the volume maintaining range is designed as:

$Th = T \times (1 - acc.\ dose) \times 0.5$;

$T=8 \times 60 \times 60/2^{((V-X)/3)}$;

$acc.\ dose = \Sigma S$; and

S=t/T, where V represents volume detected by the detecting unit 14 at an unit time closest to the volume maintaining range before entering the volume maintaining range; X represents the lower boundary value of the second volume range D2; S represents a playing dosage per unit time; acc. dose represents a cumulative playing dosage (i.e., a sum of the playing dosage S of the entire volume generated by the sonic processor 12 at an unit time closest to the volume maintaining range before entering the volume maintaining range); and t represents unit time for a single drop amount. In the embodiment, unit time t is about 1 second and the lower boundary value X is about 85 dB, but the present disclosure is not limited thereto.

For example, in FIG. 4A, when the volume V4 is located in a volume maintaining range P1 of the second volume range D2, the control unit 16 is configured to maintain the volume V4 in a time interval T4. Similarly, when the volume V5 is located in a volume maintaining range P2, the control unit 16 is configured to maintain the volume V5 in a time interval T5. Specifically, lengths of the time intervals T4 and T5 are greater than any of the time intervals T2 and T3. In some embodiments, the length Th of the time interval corresponding to the volume maintaining range is less than about 900 seconds. In some embodiments, the length Th of the time interval corresponding to the volume maintaining range can be substantially equal to or be greater than about 900 seconds.

In the embodiment, the time interval T5 is not consecutive to the time interval T4 by the separation of the time interval T3. In other words, the volume maintaining range P1 is consecutive between the consecutive drop ranges F2 and F3.

In step 1008, in the case where the volume generated by the electronic device 1 is in the second volume range D2 (e.g., between about 85 dB and about 100 dB), the volume generated by the sonic processor 12 is decreased per unit time according to a corresponding volume drop rate calculated by the control unit 16 until the volume drops by 3 dB, and then the volume is maintained for a time interval.

In step 1009, in the case where the volume generated by the electronic device 1 is in the second volume range D2 (e.g., between about 85 dB and about 100 dB), an average sound pressure level in the consecutive drop range or in the volume maintaining range is measured by the detecting unit 14. Next, the control unit 16 is configured to accumulate the calculated playing dosage to the sum of the playing dosage of the entire generated volume (including the first and second volume ranges D1 and D2) to obtain a cumulative playing dosage per unit time. The cumulative playing dosage is used to determine in step 1010.

In the embodiment, a formula of the playing dosage S corresponding to volume per unit time is designed as:

$$S=t/T; \text{ and}$$

$$T=8\times60\times60/2^{((V-X)/3)},$$ where t represents unit time for a single drop amount; V represents volume detected by the detecting unit 14 per unit time; and X represents the lower boundary value of the second volume range D2. In the embodiment, unit time t is about 1 second, volume V is located in the second volume range D2, and the lower boundary value X of the second volume range D2 is about 85 dB, but the present disclosure is not limited thereto.

For example, in FIG. 4A, when the volume V4 is located in the second volume range D2, the control unit 16 is configured to calculate a corresponding playing dosage per unit time according to the volume V4. Next, the control unit 16 is configured to accumulate the calculated playing dosage to the sum of the playing dosage of the entire generated volume (including the first volume range D1, the consecutive drop range, and the volume maintaining range) to obtain a cumulative playing dosage A2. Therefore, the control unit 16 can plot the cumulative playing dosage curve A as shown in FIG. 4A for the volume detected by the detecting unit 14 per unit time.

In step 1010, in the case where the volume generated by the electronic device 1 is in the second volume range D2 (e.g., between about 85 dB and about 100 dB), it is determined by the control unit 16 whether the cumulative playing dosage is greater than the preset cumulative value per unit time. In the embodiment, the preset cumulative value is designed to be 1, but the present disclosure is not limited thereto. When the cumulative playing dosage is not greater than the preset cumulative value, then step 1001 is re-executed. When the cumulative playing dosage is greater than the preset cumulative value, the control unit 16 is configured to restrict the electronic device 1 from generating a sound greater than the lower boundary value of the second volume range D2 and to end method 1000 of automatically decreasing volume. Thereby, method 1000 can prevent the user from receiving a strong volume for a period of time to cause hearing damage.

In some embodiments, when the cumulative playing dosage is greater than the preset cumulative value, the warning unit 18 as shown in FIG. 1 receives the signal from the control unit 16, and then issues an alert in the manner of sound, light, vibration or a combination thereof to remind the user of the electronic device 1 that only the sound below the lower boundary value of the second volume range D2 can be generated, so as to avoid the user's hearing damage. In some embodiments, the user can actively use the reset unit 17 as shown in FIG. 1 to reset the cumulative playing dosage.

Therefore, when the volume generated by the electronic device 1 is in the first volume range D1 (e.g., greater than about 100 dB), the volume drop rate R1 used to lower the volume per unit time in the first volume range D1 can be greater than that in the second volume range D2 (e.g., the weight W used to calculate the volume drop rate in the first volume range D1 is about 1.5 greater than that in the second volume range D2). Hence, the method can switch the volume to a lower volume range within a shorter time limit (e.g., 15 minutes) to avoid the user's hearing damage. For example, as shown in FIG. 3A, the volume generated by the electronic device 1 takes about 73 seconds from about 120 dB to about 100 dB using method 1000, but the present disclosure is not limited thereto.

When the volume generated by the electronic device 1 is in the second volume range D2 (e.g., between about 85 dB and about 100 dB), the method can switch the volume to a further lower volume range within another shorter time limit (e.g., 8 hours) to avoid the user's hearing damage. For example, as shown in FIG. 4A, the volume generated by the electronic device 1 takes about 1 hour from about 100 dB to about 85 dB using method 1000, but the present disclosure is not limited thereto.

Further, the volume drop rate used to lower the volume per unit time in the second volume range D2 can be less than that in the first volume range D1 (e.g., the weight W used to calculate the volume drop rate in the second volume range D2 is 1 less than that in the first volume range D1). Then, the volume drop rate in the second volume range D2 can further within a limit range (e.g., in a range from about 0.1 (dB/sec) to about 0.5 (dB/sec)), such that the user does not perceive that the volume is lowered by the electronic device 1 during a volume decreasing process, thereby enabling the user to obtain a better user experience.

Reference is made to FIGS. 4A, 4B, and 4C. Compared with the first volume range D1 as shown in FIG. 3A, the single drop amount in the consecutive drop range of the volume range D2 is less than the single drop amount in the first volume range D1 in FIG. 3A. For example, the single drop amounts Q2 and Q3 located in the consecutive drop ranges F2 and F3 are less than the single drop amount Q1 located in the first volume range D1 in FIG. 3A.

Further, compared with the first volume range D1 as shown in FIG. 3A, the volume drop rate in the consecutive drop range of the second volume range D2 is less than the volume drop rate in the first volume range D1 in FIG. 3A. For example, the volume drop rates R2 and R3 of the consecutive drop ranges F2 and F3 are less than ⅔ of the volume drop rate R1 of the first volume range D1.

In FIG. 4A, the time intervals T2 and T3 corresponding to the consecutive drop ranges F2 and F3 in the second volume range D2 are not consecutive. The time interval T3 is later than the time interval T2. A length of the time interval T3 is substantially equal to a length of the time interval T2. In some embodiments, the length of the time interval T3 can be greater than the length of the time interval T2.

In FIG. 4A, a decreasing amplitude H3 of the consecutive drop range F3 in the second volume range D2 is substantially equal to a decreasing amplitude H2 of the consecutive drop range F2, but the present disclosure is not limited thereto. In some embodiment, different consecutive drop ranges in the second volume range D2 can substantially have the same decreasing amplitude. For example, the decreasing amplitude H3 of the consecutive drop range F3 and the decreasing amplitude H2 of the consecutive drop range F2 can be about 3 dB.

Figure 5A:
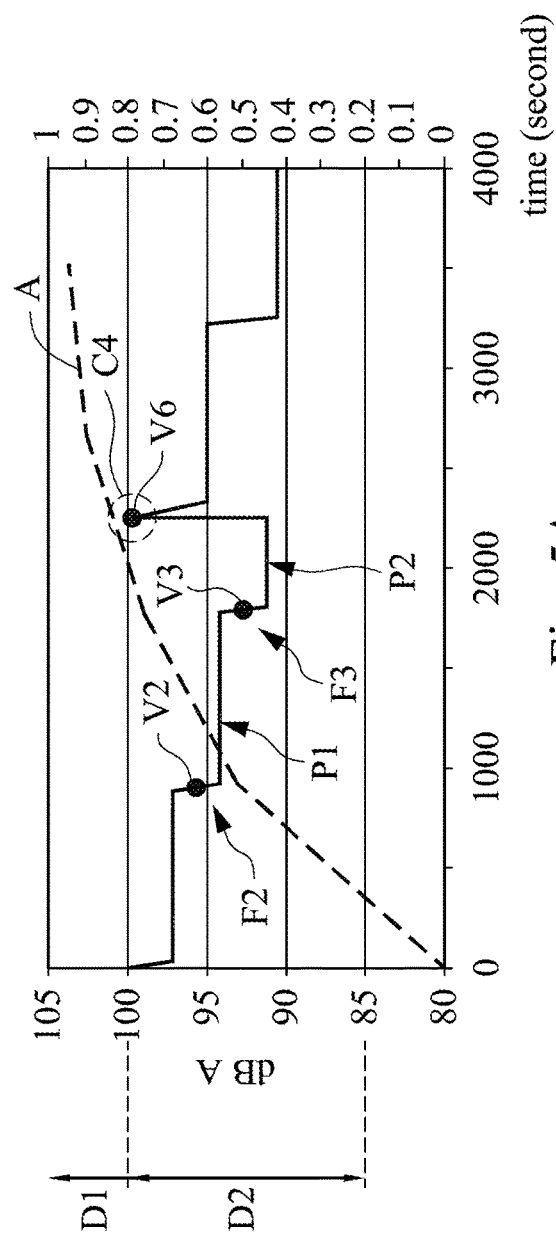
FIG. 5A is a schematic diagram of volume corresponding to time generated by a method of automatically decreasing volume in accordance with some embodiments of the present disclosure.
Figure 5B:
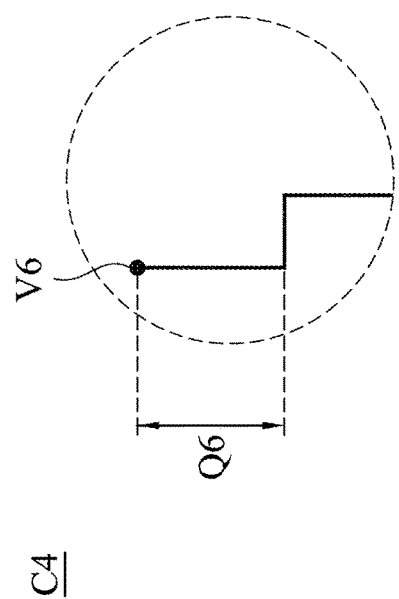
FIG. 5B is a partial enlarged view of an area C4 in FIG. 5A in accordance with some embodiments of the present disclosure.

Reference is made to FIGS. 5A and 5B. FIG. 5A is a schematic diagram of volume corresponding to time generated by the method 1000 of automatically decreasing volume in accordance with some embodiments of the present disclosure. FIG. 5B is a partial enlarged view of an area C4 in FIG. 5A in accordance with some embodiments of the present disclosure. As shown in FIG. 5A, a relationship between the volume change and the time is substantially the same as the relationship between the volume change and the time as shown in FIG. 4A, and the related detailed descriptions may refer to the foregoing paragraphs, and are not described again herein. It is noted that, the difference between the present embodiment and the embodiment in FIG. 4A is in that when the volume generated by the sonic processor 12 is artificially turned up, the control unit 16 re-executes step 1001.

Specifically, the control unit 16 is configured to determine whether the volume V6 as shown in FIG. 5A is greater than the volume generated by the previous unit time in the second volume range D2 to determine whether the volume generated by the sonic processor 12 is artificially increased. For example, a detecting time point of the volume V6 as shown in FIG. 5A is later than another detecting time point of a volume in the volume maintaining range P2, and the volume V6 is greater than the volume in the volume maintaining range P2. Therefore, the control unit 16 determines that the volume generated by the sonic processor 12 is artificially turned up, and then the electronic device 1 re-executes step 1001 to decrease the volume generated by the sonic processor 12.

Firstly, the volume V6 will be decreased by a single drop amount Q6. The single drop amount Q6 is calculated according to the volume V6. Next, the electronic device 1 decreases the volume generated by the sonic processor 12 according to the volume drop rate R6 calculated by the control unit 16 per unit time. Specifically, the weight W used to calculate the volume drop rate R6 is designed to be 2, but the present disclosure is not limited thereto. In some embodiments, the weight W used to calculate the volume drop rate R6 can be designed to be 1. In some embodiments, the single drop amount Q6 as shown in FIG. 5B is greater than any of the single drop amounts Q2 and Q3 as shown in FIGS. 4B and 4C.

Figure 6:
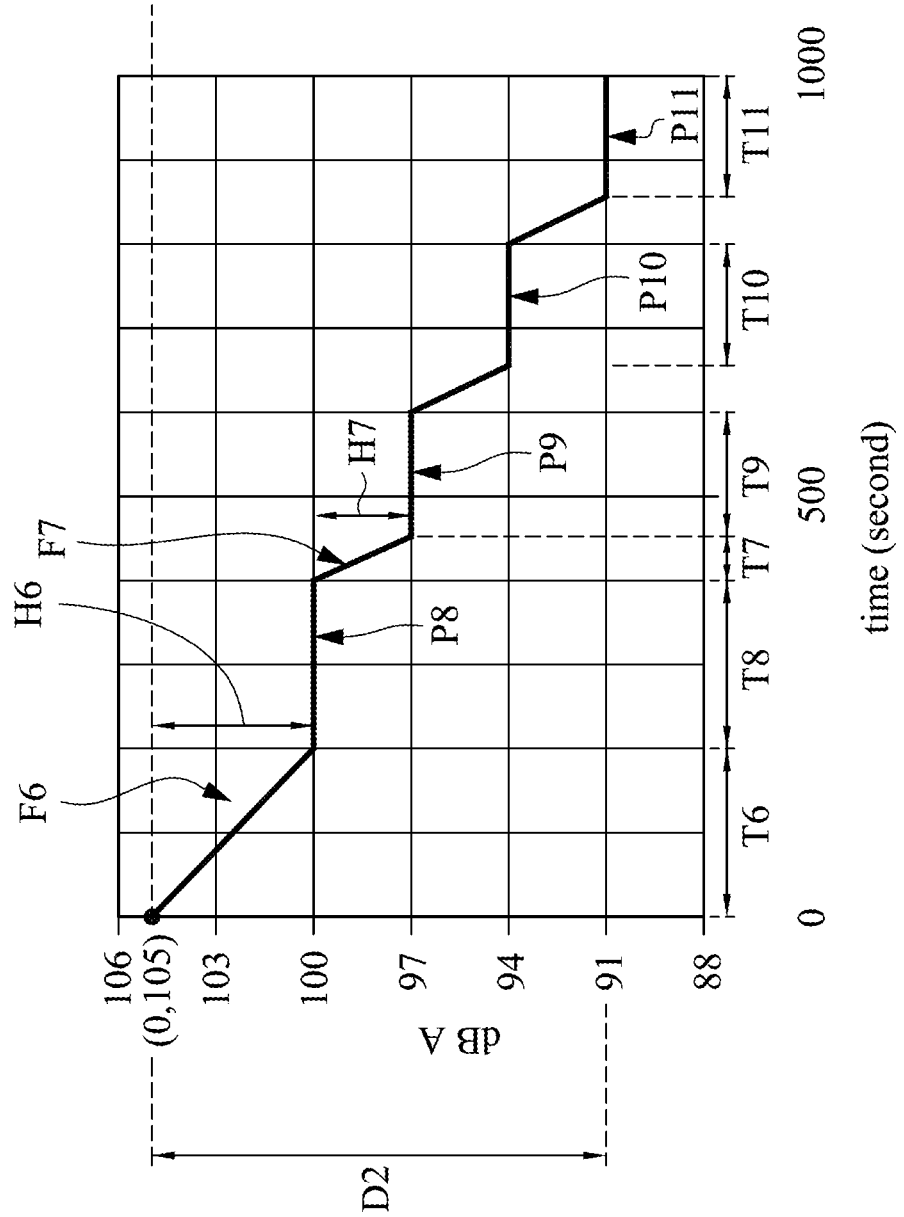
FIG. 6 is a schematic diagram of volume corresponding to time generated by a method of automatically decreasing volume in accordance with some embodiments of the present disclosure.

Reference is made to FIG. 6. FIG. 6 is a schematic diagram of volume corresponding to time generated by the method 1000 of automatically decreasing volume in accordance with some embodiments of the present disclosure. In the embodiment, a relationship between the volume change and the time is substantially the same as the relationship between the volume change and the time as shown in FIG. 4A, and the related detailed descriptions may refer to the foregoing paragraphs, and are not described again herein.

It is noted that, the difference between the present embodiment and the embodiment in FIG. 4A is in that the electronic device 1 has previously set a maximum output volume. Therefore, method 1000 or the electronic device 1 using the same may omit the configuration of the first volume range D1 as shown in FIG. 3A, and the upper boundary value of the second volume range D2 is designed as the aforementioned maximum output volume. As shown in FIG. 6, if the maximum output volume of the electronic device 1 is set to about 105 dB, the volume of the second volume range D2 is defined to be between about 85 dB (not shown) and about 105 dB, but the present disclosure is not limited thereto.

Further, in the embodiment, the decreasing amplitudes of different consecutive drop ranges in the second volume range D2 can be different. That is, a volume drop rate in a consecutive drop range performed later in the second volume range D2 may be greater or less than another volume drop rate in another consecutive drop range performed earlier. In some embodiments, a volume drop rate in a consecutive drop range performed later in the second volume range D2 may be substantially the same as another volume drop rate in another consecutive drop range performed earlier.

For example, the consecutive drop range F7 is executed after the consecutive drop range F6. A decreasing amplitude H7 of the consecutive drop range F7 is less than a decreasing amplitude H6 of the consecutive drop range F6. A volume drop rate R7 in the consecutive drop range F7 is greater than a volume drop rate R6 in the consecutive drop range F6. Therefore, a time interval T7 corresponding to the consecutive drop range F7 can be less than a time interval T6 corresponding to the consecutive drop range F6.

In the embodiment, volumes of the volume maintaining ranges are fixed values respectively which are substantially different from each other, and a difference in volume between any two adjacent volume maintaining ranges is substantially the same.

For example, please refer to FIG. 6. The volumes of the volume maintaining ranges P8, P9, P10, and P11 are about 100 dB, about 97 dB, about 94 dB, and about 91 dB, respectively, but the present disclosure is not limited thereto. A difference in volume between any two adjacent volume maintaining ranges P8, P9, P10, and P11 is about 3 dB, but the present disclosure is not limited thereto.

According to the foregoing embodiments of the disclosure, it can be seen that, when the volume generated by the electronic device is in the first volume range (e.g., greater than about 100 dB), the volume drop rate used to lower the volume per unit time in the first volume range can be greater than that in the second volume range (e.g., in a range between about 85 dB to about 100 dB). Hence, the method can switch the volume to a lower volume range within a shorter time limit (e.g., 15 minutes) to avoid the user's hearing damage.

Similarly, when the volume generated by the electronic device is in the second volume range D2 (e.g., between about 85 dB and about 100 dB), the user can switch the volume to a further lower volume range within another shorter time limit (e.g., 8 hours) to avoid the user's hearing damage. Further, the volume drop rate used to lower the volume per unit time in the second volume range D2 can be less than that in the first volume range D1. Then, the volume drop rate in the second volume range D2 can further within a limit range (e.g., in a range from about 0.1 (dB/sec) to about 0.5 (dB/sec)), such that the user does not perceive that the volume is lowered by the electronic device 1 during a volume decreasing process, thereby enabling the user to obtain a better user experience.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of automatically decreasing volume, comprising:
    detecting a volume of a sound generated by an electronic device;
    determining whether the volume is in a first volume range or in a second volume range, wherein the volume in the first volume range is higher than the volume in the second volume range;
    calculating a first single drop amount according to the volume when the volume is in the first volume range; and
    calculating a second single drop amount according to the volume when the volume is in the second volume range, wherein the second single drop amount is less than the first single drop amount, the first single drop amount per unit time within the first volume range is defined as a first volume drop rate, the second single drop amount per unit time within the second volume range is defined as a second volume drop rate, and the second volume drop rate is less than the first volume drop rate.

2. The method of claim 1, wherein the first volume range is greater than about 100 dB.

3. The method of claim 1, wherein the first volume range is formed by a plurality of the first single drop amounts that are consecutive.

4. The method of claim 1, wherein the second volume range is in a range from about 85 dB to about 100 dB.

5. The method of claim 1, wherein the second volume drop rate of the second volume range is less than ⅔ of the first volume drop rate of the first volume range.

6. An electronic device, comprising:
    a sonic processor configured to generate a sound;
    a detecting unit configured to detect a first volume of the sound generated by the electronic device; and
    a control unit configured to determine whether the first volume is in a first consecutive drop range or in a second consecutive drop range,
    further configured to decrease the first volume according to a first single drop amount when the first volume is in the first consecutive drop range, and
    further configured to decrease the first volume according to a second single drop amount when the first volume is in the second consecutive drop range, wherein the first consecutive drop range corresponds to a first time interval, the second consecutive drop range corresponds to a second time interval and the second time interval is not consecutive to the first time interval.

7. The electronic device of claim 6, wherein the control unit is configured to calculate the first single drop amount or second single drop amount according to the first volume.

8. The electronic device of claim 6, wherein the first and second consecutive drop ranges are in a range from about 85 dB to about 120 dB.

9. The electronic device of claim 6, wherein the first consecutive drop range is formed by a plurality of the first single drop amounts that are consecutive.

10. The electronic device of claim 6, wherein the second consecutive drop range is formed by a plurality of the second single drop amounts that are consecutive.

11. The electronic device of claim 6, wherein the control unit is further configured to maintain the first volume in a third time interval when the first volume is in a first volume maintaining range,
    wherein the first volume maintaining range is consecutive between the first and second consecutive drop ranges and a length of the third time interval is greater than any of lengths of the first and second time intervals.

12. The electronic device of claim 11, wherein the control unit is further configured to maintain the first volume in a fourth time interval when the first volume is in a second volume maintaining range,
    wherein the fourth time interval is not consecutive to the third time interval.

13. The electronic device of claim 11, wherein the control unit is configured to calculate a first playing dosage according to the first consecutive drop range and the first time interval,
    to calculate a second playing dosage according to the first volume maintaining range and the third time interval,
    to determine whether a sum of the first and second playing dosages is greater than a preset cumulative value, and
    to limit the electronic device to generate another sound with a volume greater than a preset volume when the sum of the first and second playing dosages is greater than the preset cumulative value,
    wherein the volumes in the first and second consecutive drop ranges are greater than the preset volume.

14. The electronic device of claim 6, wherein the first single drop amount per unit time within the first consecutive drop range is defined as a first volume drop rate, the second single drop amount per unit time within the second consecutive drop range is defined a second volume drop rate, and the second volume drop rate is less than or substantially equal to the first volume drop rate.

15. The electronic device of claim 14, wherein the first and second volume drop rates are in a range from 0.1 dB/sec to 0.5 dB/sec.

16. The electronic device of claim 6, wherein an amplitude of the second consecutive drop range is substantially the same as an amplitude of the first consecutive drop range.

17. The electronic device of claim 6, wherein an amplitude of the second consecutive drop range is different from an amplitude of the first consecutive drop range.

18. The electronic device of claim 6, wherein the second time interval is later than the first time interval and a length of the second time interval is greater than or substantially equal to a length of the first time interval.

19. The electronic device of claim 6, wherein the control unit is further configured to determine whether a second volume is greater than the first volume, wherein a detecting time point of the second volume is later than a detecting time point of the first volume, and the control unit is further configured to calculate a third single drop amount according to the second volume when the second volume is greater than the first volume, wherein the third single drop amount is greater than or substantially equal to any of the first and second single drop amounts.

* * * * *